United States Patent [19]

Tatsumi et al.

[11] Patent Number: 5,639,558
[45] Date of Patent: Jun. 17, 1997

[54] INSULATING RESIN-COATED BONDING WIRE

[75] Inventors: Kohei Tatsumi; Hiroyuki Kondo; Michio Nitta; Shinya Nariki, all of Kawasaki, Japan

[73] Assignee: Nippon Steel Corporation, Tokyo, Japan

[21] Appl. No.: 398,776

[22] Filed: Mar. 6, 1995

[30] Foreign Application Priority Data

Mar. 10, 1994 [JP] Japan ................... 6-040059

[51] Int. Cl.$^6$ ............... B32B 15/08; H01L 23/29
[52] U.S. Cl. ............... 428/458; 428/375; 257/784
[58] Field of Search ................... 428/375, 458

[56] References Cited

U.S. PATENT DOCUMENTS 5,337,941  8/1994  Higashiura et al. ............ 228/205
5,396,104  3/1995  Kimura ............................. 428/458
5,415,922  5/1995  Tatsumi et al. ................... 428/375

FOREIGN PATENT DOCUMENTS 61-19473A   1/1986  Japan.
62-139217A  6/1987  Japan.

*Primary Examiner*—Tae Yoon
*Attorney, Agent, or Firm*—Pollock, Vande Sande & Priddy

[57] ABSTRACT

The present invention provides a bonding wire having a good bonding property, no damage sustained to coatings during bonding, and capability of retaining an excellent insulating property even when wires come into impact with one another in the resin molding step, characterized in that the resin has a thermal weight loss at a temperature of 110° C. in air of not less than 85% and an tensile strength at 180° C. of not less than 300 kgf/cm$^2$. The resins satisfying the specified characteristic conditions can be selected from the group consisting of polyparabanic acid based resins and polyarylate resins.

9 Claims, 1 Drawing Sheet

■ POLYCARBONATE RESIN
□ POLYARYLATE RESIN A
◆ POLYARYLATE RESIN B
◇ POLYPARABANIC ACID

- ■ POLYCARBONATE RESIN
- □ POLYARYLATE RESIN A
- ◆ POLYARYLATE RESIN B
- ◇ POLYPARABANIC ACID 5,639,558

INSULATING RESIN-COATED BONDING WIRE

DESCRIPTION

BACKGROUND OF THE INVENTION

Field of the Invention

The present invention relates to a bonding wire for connecting a semiconductor chip with an external facility, and particularly to an insulating resin-coated bonding wire.

BACKGROUND OF THE INVENTION

Electrode pads on a semiconductor chip and external output terminals, i.e., leads are connected with each other by bonding wires. Usually fine wires of metals such as Au, Cu, Al and the like have been used as bonding wires which connect electrode pads with leads to form loops at a certain level. Because the bonding wires are drawn from the portions thermally adhered under pressure to the electrode pads, the loops often are slacked so that they may come into contact with the semiconductor chip resulting in short-circuit. In recent years, larger scale integrated circuits require a higher number of pins in the connection structure which tends to increase the distance between the electrode pad and the lead connection requiring longer wire span. This in turn, facilitates occurrence of the phenomenon that the loops curl to flow laterally. Thus, the probability for the adjacent wires to contact with one another to form short-circuit becomes higher.

For the purpose of inhibiting the formation of short-circuit due to contacts of bonding wires with one another or with semiconductor chips, there have been proposed bonding wires insulated by coating thermal resistant polyurethane layer as disclosed in JP 61-19473 A, and those insulated by coating polyimide resin layer as disclosed in JP 62-139217 A.

The conventional insulated bonding wires, however, have the following difficulties:

Most bonding wires are put into connection by a bonding method, so-called ball-bonding, where the tip of the resin coated wires is melted by arc discharge into a ball before the wires are connected to the electrodes on the surfaces of the semiconductor chips. The resin is removed by burning or thermal decomposition during the formation of the ball. When the resin used produces a great deal of residue at that time, the residue remains deposited on the ball to prevent satisfactory connection.

Moreover, there is a problem that damages on the coating caused during the bonding and resin molding may generate insulation failure. That is, failure of the coatings caused by friction of the wires with clampers and capillaries at the time of bonding, or by collision of the wires with previously formed wire loops as well as deterioration and damages of coatings caused by heat and mechanical stresses during the resin molding are attributable to insulation failure.

SUMMARY OF THE INVENTION

An object of the present invention is to provide a bonding wire having a good bonding property, no damage sustained to coatings during bonding, and capability of retaining an excellent insulating property even if wires come into contact with one another in the resin molding step, thereby overcoming shortcomings of the prior art.

Another object of the present invention is to provide a bonding wire having insulating resin coating, characterized in that the resin has a thermal weight loss at a temperature of 1100° C. in air of not less than 85% and a tensile strength at 180° C. of not less than 300 kgf/cm$^2$.

Still another object of the present invention is to provide a bonding wire having insulating resin coating as above, in which the coating resin is at least one selected polymer from the group consisting of polyparabanic acid based resins and polyarylate resins.

DETAILED DESCRIPTION OF PREFERRED EMBODIMENTS

Figure 1:
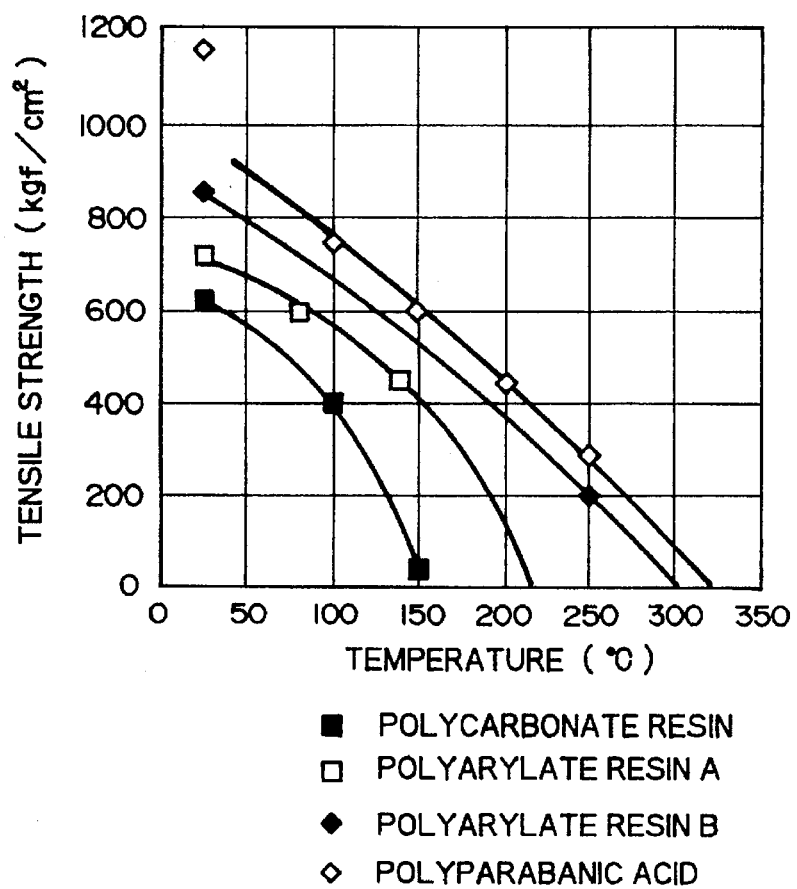
FIG. 1 shows temperature dependence of the tensile strength of each resin.

In order to achieve the aforementioned objects, the present invention provides an insulating resin coated bonding wire characterized in that the resin for the coating has a thermal weight loss at a temperature of 1100° C. in air of not less than 85% and an tensile strength at 180° C. of not less than 300 kgf/cm$^2$.

The resins which can meet the above characteristic conditions to be used in the present invention include at least one polymer selected from the group consisting of polyparabanic acid based resins and polyarylate resins.

The use of the resin having a thermal weight loss at 1100° C. in air of not less than 85% in the present invention allows the bonding wires to have a balling up property which causes no hindrance to connecting them with electrode pads on semiconductor chips and those resins having a mechanical strength such as a tensile strength at 180° C. of not less than 300 kgf/cm$^2$ do not generate coating failure due to impacts at the time of bonding or molding.

The thermal weight loss can be determined by measuring a weight loss of a resin sample with a thermal balance while heating the sample at a temperature increase rate of 10° C./min. The resin must sufficiently removed from the surface of the ball of the bonding wires at the ball forming temperature, i.e., at least 85% of the resin coating must be removed by burning or thermal decomposition. When the bonding wires to be used comprise, for example, Au fine wire, its melting temperature is 1100° C., at and above which temperature the ball is formed, and therefore, if the coating resins exhibits a thermal weight loss of not less than 85% at this temperature, they have no influence on the ball connection and their bonding property is not impaired. More preferably, such resins as having a thermal weight loss of not less than 95% at 1200° C. should be selected.

On the other hand, in order to prevent coating failure which may be caused in the course of bonding and resin molding steps owing to friction with capillaries and clampers, contacts of loops with one another for curl phenomenon, touches between wires occurring in the case of cross-bonding and the like, resins to be used for coating bonding wires must have a mechanical strength sufficiently resistant to such failure at temperatures of not lower than the resin mold loading temperature of around 180° C. As a result of our various experiments, it has been confirmed that resins having a tensile strength of 300 kgf/cm$^2$ at 180° C. as standard can not cause any coating failure. Particularly, since this type of resin may be drastically lowered in its strength when exceeding its glass transition temperature, the glass transition temperature should be not lower than 200°

C., preferably not lower than 250° C., on which criterion resins having a mechanical strength as defined above can be selected.

The resins to be used in the present invention are preferably polyparabanic acid based resins or polyarylate resins and may be at least one selected from the following resins having various characteristics as described above:

Polyparabanic acid based resins represented by the general formula (1):

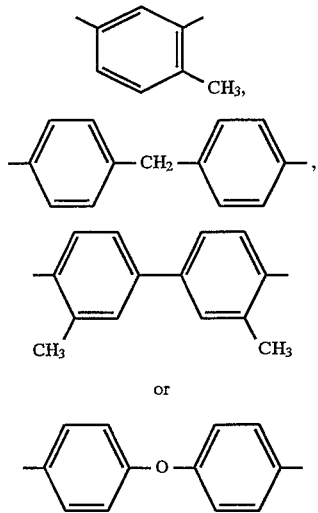

where R represents, for example,

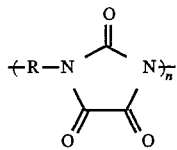  (a)

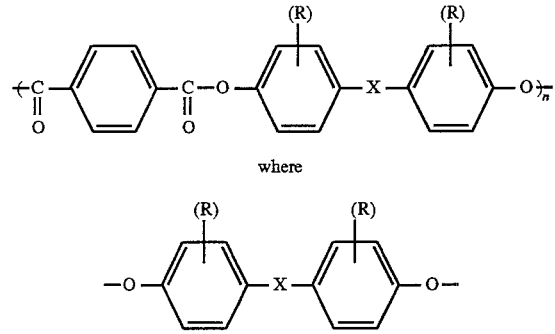

Polyarylate resins represented by the general formula (2):

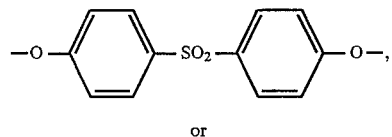

represents, for example,

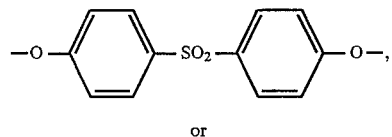 (a)

or

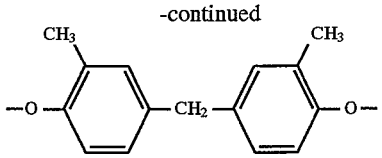 (b)

Polyarylate resins represented by the general formula (3):

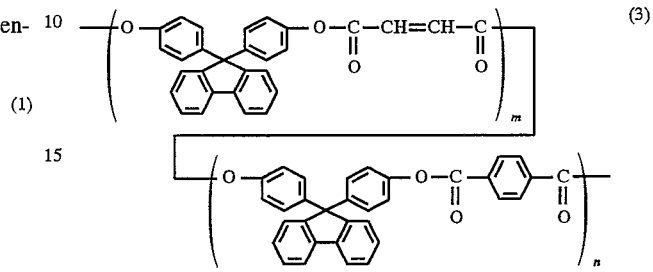

The resins to be used in the present invention are not limited to those as defined above and further include, for example, polysulfones represented by the general formula:

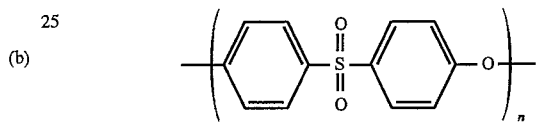

and polyether etherketones represented by the general formula:

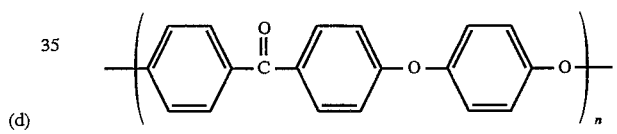

and polymer alloys of these polymers, and others, whose strength can satisfy the aforementioned characteristic conditions at 180° C.

The thickness of the resin coating of the present invention is not critical, but should be in the order of 0.05 to 2 μm.

EXAMPLES

Each resin as indicated in Table 1 was coated on a Au fine wire having a diameter of 30 μm to a thickness of 0.5 μm to produce an insulated bonding wire, which was tested to evaluate bonding property and insulating property.

Exemplary insulated bonding wires according to the present invention were produced by using polyarylate resin B (Elmeck® available from Kanegafuchi Chemical Industry Co., Ltd.) represented by the general formula (2) with the moiety (a), polyarylate resin C represented by the general formula (3) and polyparabanic acid resin (SOLLAC® available from Tonen Corporation) represented by the general formula (1) with the substituent (b), and comparative examples were also produced by similarly coating with polycarbonate resin (Novalex® 7022A available from Mitsubishi Chemical Industries, Ltd.), polyarylate resin A (U Polymer® U100 available from Unitika Ltd.) represented by the following general formula:

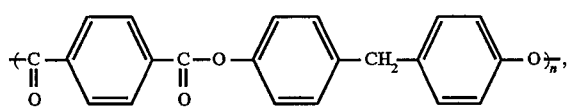

polyimide resin A (KERIMID® available from Chiba-Geigy Corp.), polyimide resin (LARC-IPI® available from Mitsui Toatsu Chemicals, Inc.) and polyamideimide (TORLON® available from Mitsubishi Chemical Industries, Ltd.). All the samples of the thus produced wires were identically tested.

The thermal weight loss and glass transition temperature of each resin coated are set forth in Table 1 and the tensile strength is shown in FIG. 1 as a function of temperature.

Evaluation of bonding property was made by using a wire bonding apparatus, UTC 50 available from SHINKAWA which enables continuous bonding of 6000 wires or more. In the shearing test with first bond, 50 grams or more were considered a pass (○). The diameter of ball was 75 mmφ in all cases.

Figure 2:
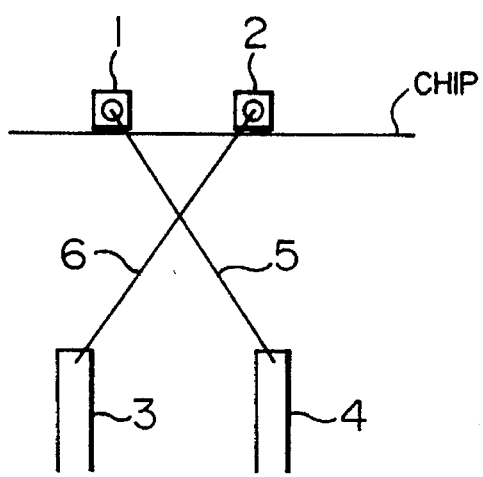
FIG. 2 shows a schematic drawing of a method for evaluating insulating property.

In the insulation test, electrode pads 1 and 2 on a chip were connected to leads 3 and 4 as shown in FIG. 2 with a first bonding wire 5, whose loop was fixed at a relatively higher level and a second bonding wire 6, whose loop was fixed at a lower level than the first loop in order to ensure the contact between the wires. The evaluation was made by bonding, molding, then separating each unit, and then measuring electric leakage between the lead terminals.

The results as shown in Table 1, indicate that the insulated bonding wires according to the present invention have a good bonding property, less tendency to cause short circuit and an excellent resin strength such as tensile strength at 180° C.

In contrast, comparative examples, polycarbonates and polyarylate resin A caused short circuit due to coating failure because they have a lower strength at high temperatures, though they have a good bonding property, as can be seen from FIG. 1. The example of polyimide has inferior bonding property because a residue remains on the ball formed at the time of bonding.

What is claimed is:

1. A bonding wire having insulating resin coating, wherein said resin is a polyarylate resin having a thermal weight loss at a temperature of 1100° C. in air of not less than 85% and a tensile strength at 180° C. of not less than 300 kgf/cm².

2. The bonding wire having insulating resin coating according to claim 1, wherein said polyarylate resin is represented by the formula

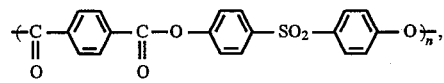

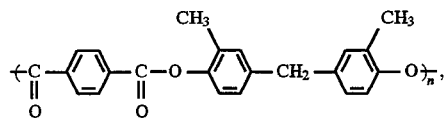

or

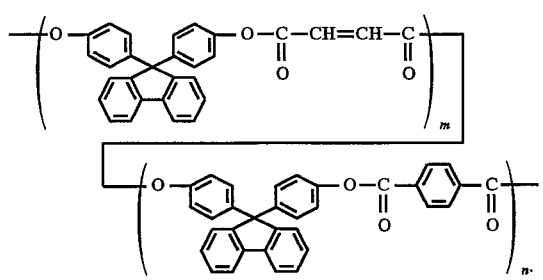

3. The bonding wire having insulating resin according to claim 1, wherein said insulating resin has a thickness of 0.05 to 2 μm.

4. A bonding wire consisting of a wire and an insulating resin layer coated on the wire, wherein said resin is a polyparabanic acid based resin having a thermal weight loss at a temperature of 1100° C. in air of not less than 85% and a tensile strength at 180° C. of not less than 300 kgf/cm².

TABLE 1

| Resin | Thermal weight loss (%) 1100° C. | Thermal weight loss (%) 1200° C. | Glass transition temperature (°C.) | Bonding property | Rate of short generation | Tensile strength at 180° C. (kgf/cm²) | Remarks |
| --- | --- | --- | --- | --- | --- | --- | --- |
| Polycarbonate | 100 | 100 | 156 | ○ | 30 | 50 or less | Comp. Example |
| Polyarylate A | 100 | 100 | 193 | ○ | 6 | 120 | Comp. Example |
| Polyarylate B | 88 | 100 | 290 | ○ | 0 | 400 | Present invention |
| Polyarylate C | 85 | 96 | 350 | ○ | 0 | 400 or more | Present invention |
| Polyparabanic acid | 100 | 100 | 350 | ○ | 0 | 390 | Present invention |
| Polyimide A | 70 | 84 | 350 | x | 0 | 350 or more | Comp. Example |
| Polyimide B | 80 | 91 | 290 | x | 0 | 350 or more | Comp. Example |
| Polyamideimide | 69 | 78 | 246 | x | 0 | 350 or more | Comp. Example |

As described above, the present invention makes it possible to provide a bonding wire having a good bonding property, no damage sustained to coatings during bonding, and capability of retaining an excellent insulating property even when wires come into impact with one another in the resin molding step by using specified coating resins. Particularly the bonding wires of the present invention can advantageously be used with large scale integrated circuits and specific semiconductor devices of the lead-on-chip type having bus bars in the center of the chip, and therefore the present invention can achieve extremely great effects in industry.

5. The bonding wire having insulating resin coating according to claim 4, wherein said polyparabanic acid based resin is represented by the formula

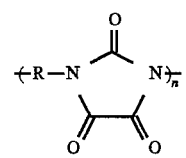

wherein R represents

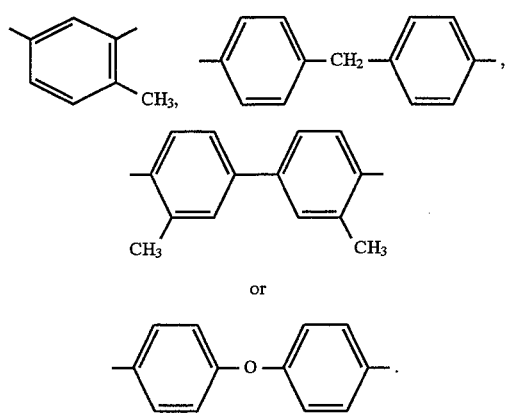

or

6. The bonding wire having insulating resin according to claim 4, wherein said insulating resin has a thickness of 0.05 to 2 μm.

7. A bonding wire consisting of a wire and an insulating resin layer coated on the wire, wherein said resin is a polyarylate having a thermal weight loss at a temperature of 1100° C. in air of not less than 85% and a tensile strength at 180° C. of not less than 300 kgf/cm$^2$.

8. The bonding wire having insulating resin coating according to claim 7, wherein said polyarylate resin is represented by the formula

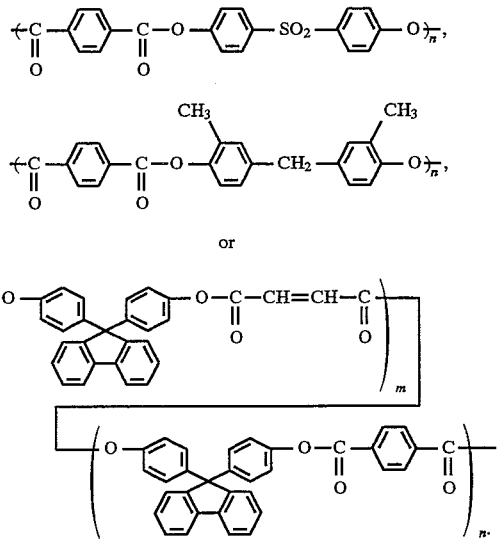

9. The bonding wire having insulating resin according to claim 7, wherein said insulating resin has a thickness of 0.05 to 2 μm.

* * * * *